United States Patent [19]

Lee

[11] Patent Number: 5,394,104
[45] Date of Patent: Feb. 28, 1995

[54] POWER-ON RESET CIRCUIT INCLUDING DUAL SENSE AMPLIFIERS

[75] Inventor: Napoleon W. Lee, Fremont, Calif.

[73] Assignee: Xilinx, Inc., San Jose, Calif.

[21] Appl. No.: 293,782

[22] Filed: Aug. 22, 1994

Related U.S. Application Data

[63] Continuation of Ser. No. 904,417, Jun. 25, 1992, abandoned.

[51] Int. Cl.$^6$ .................... H03K 17/22; H03L 7/00
[52] U.S. Cl. ........................... 327/143; 327/77; 327/78
[58] Field of Search ............... 307/272.3, 296.4, 354, 307/362, 572

[56] References Cited

U.S. PATENT DOCUMENTS

| | | | |
|---|---|---|---|
| 4,599,672 | 7/1986 | Planer et al. | 361/92 |
| 4,611,126 | 9/1986 | Miller | 307/64 |
| 4,634,905 | 1/1987 | Campbell, Jr. | 307/594 |
| 4,788,462 | 11/1988 | Vesce et al. | 307/296.4 |
| 4,874,965 | 10/1989 | Campardo et al. | 307/272.3 |
| 4,888,498 | 12/1989 | Kadakia | 307/296.4 |
| 4,922,133 | 5/1990 | Iwahashi et al. | 307/363 |
| 4,983,857 | 1/1991 | Steele | 307/272.3 |
| 5,140,178 | 8/1992 | Yoshihara et al. | 307/272.3 |
| 5,148,051 | 9/1992 | Deierling et al. | 307/272.3 |
| 5,214,316 | 5/1993 | Nagai | 307/272.3 |

FOREIGN PATENT DOCUMENTS

| | | | |
|---|---|---|---|
| 0125522 | 8/1982 | Japan | 307/272.3 |
| 0063231 | 4/1983 | Japan | 307/272.3 |
| 0256015 | 10/1988 | Japan | 307/272.3 |

*Primary Examiner*—Terry D. Cunningham
*Attorney, Agent, or Firm*—Edel M. Young; Jeanette S. Harms

[57] ABSTRACT

A power-on reset circuit is provided which holds an integrated circuit device in a reset mode until at least two conditions are satisfied: supply voltage Vcc must be above a specified value and sense amplifiers in the device must be able to operate properly. Delay circuits and Schmitt trigger circuits also improve the stability of the signal which releases the device from its reset mode.

16 Claims, 7 Drawing Sheets

POWER-ON RESET CIRCUIT INCLUDING DUAL SENSE AMPLIFIERS

This application is a continuation of application Ser. No. 07/904,417, filed Jun. 25, 1992, now abandoned.

FIELD OF THE INVENTION

The present invention relates to power-on reset circuits for integrated circuit devices.

BACKGROUND OF THE INVENTION

A power-on reset circuit is used in an integrated circuit device to prevent logic circuits in the device from being used when the power supply voltage Vcc is not sufficient for the logic circuits to operate properly. Power-on reset circuits typically include a Vcc detect circuit which detects when Vcc has risen to a level sufficient to operate logic gates in the device. CMOS circuits will begin to operate marginally when Vcc is above the higher of Vtn and Vtp, where Vtn is the threshold voltage of N-channel transistors in the CMOS circuits and Vtp is the threshold voltage of P-channel transistors in the CMOS circuits. But CMOS circuit operation will be more reliable when Vcc is above Vtn+Vtp. To provide a guard band, Vcc detect circuits typically provide a detect signal when Vcc has risen to a higher voltage, for example 2Vtn+Vtp or 2Vtp+Vtn.

FIG. 1 shows a block diagram of such a circuit. In addition to Vcc detect circuit 110, which provides a high output signal at NR10 when Vcc has risen to 2Vtn+Vtp, delay block 120 provides a time delay on the output signal at node NR10. Reset circuit 180 provides an override reset signal in response to an externally provided reset signal. Schmitt trigger circuit 130 has a higher trigger point to rising input signals and a lower trigger point to falling input signals, and thus prevents multiple changes in reset signal on R11 in the event of small variations in the signal on NR10. Buffer 138 converts the R11 signal to the output signal on R12.

In some integrated circuit devices, however, the power-on reset circuit may release the integrated circuit device from the reset mode before all circuits in the device are able to operate properly.

SUMMARY OF THE INVENTION

According to the invention, the power-on reset circuit is released only when two different requirements are satisfied. Not only must Vcc be above a specified level but in addition, a sense amplifier or amplifiers which match those used elsewhere in the device must operate properly. Preferably two sense amplifiers, both of which match those used elsewhere, are included in the power-on reset circuit. One of them is connected so that it will detect a logical 1 input signal and the other is connected so that it will detect a logical 0 input signal. A gating device provides a release signal only when both of these sense amplifiers have detected their respective input signals. The power-on reset release signal is provided only when both a Vcc detect signal and the sense amplifier state detect signals are received.

In a preferred embodiment, the Vcc and sense amplifier release signals must pass through a delay circuit and then through a Schmitt trigger circuit, thus assuring that an output signal is generated when Vcc has risen to a steady state value and that small variations in Vcc will not produce multiple changes in the power-on reset output signal.

DETAILED DESCRIPTION OF THE INVENTION

Figure 2:
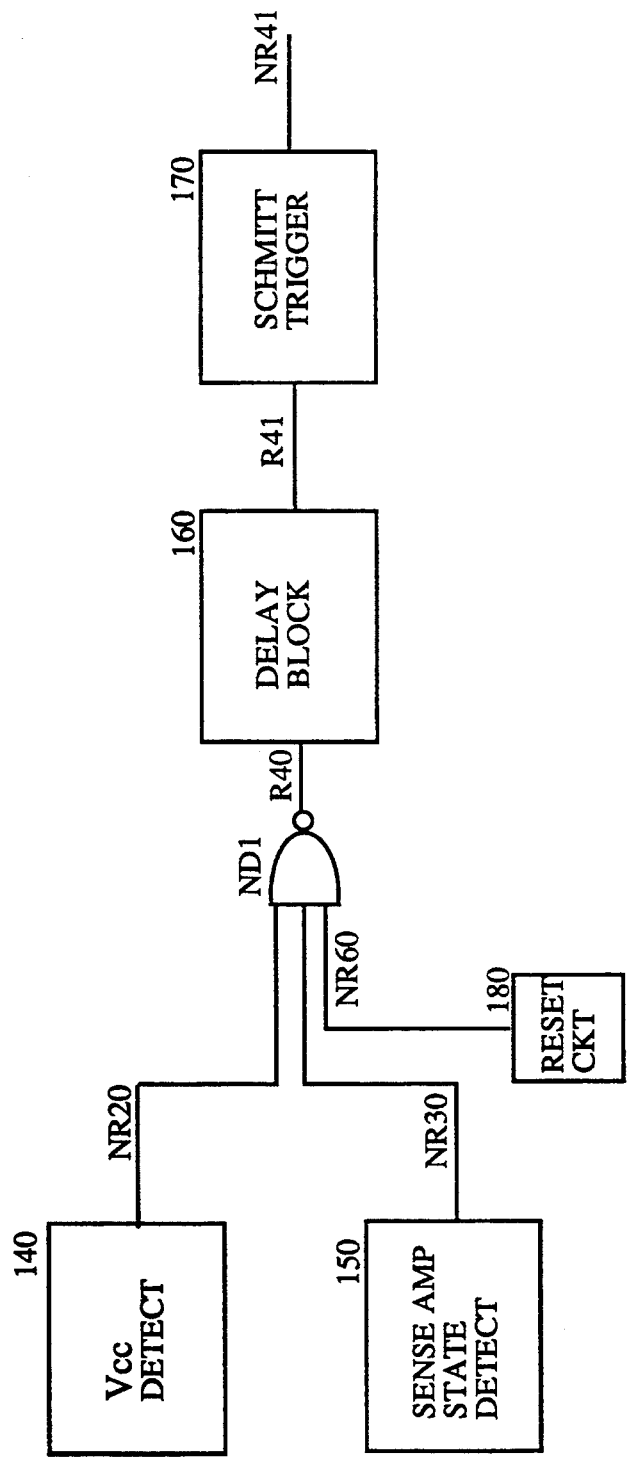
FIG. 2 shows a block diagram of one power-on reset circuit of the present invention.

FIG. 2 shows a block diagram of one embodiment of the invention. A first detect output signal from Vcc detect circuit 140 is provided on node NR20. A second detect output signal from sense amplifier state detect circuit 150 is provided on node NR30. These two signals are input to NAND gate ND1, which generates a logical 0 output signal on node R40 only when both NR20 and NR30 are high. The signal on node R40 enters delay block 160, which smooths and delays the R40 signal and provides an output signal on node R41. Schmitt trigger 170 switches at a higher trigger point to rising signals on R41 than to falling signals on R41, and thus provides a constant NR41 signal in spite of variations in R41 in the region of the trigger point.

Figure 1:
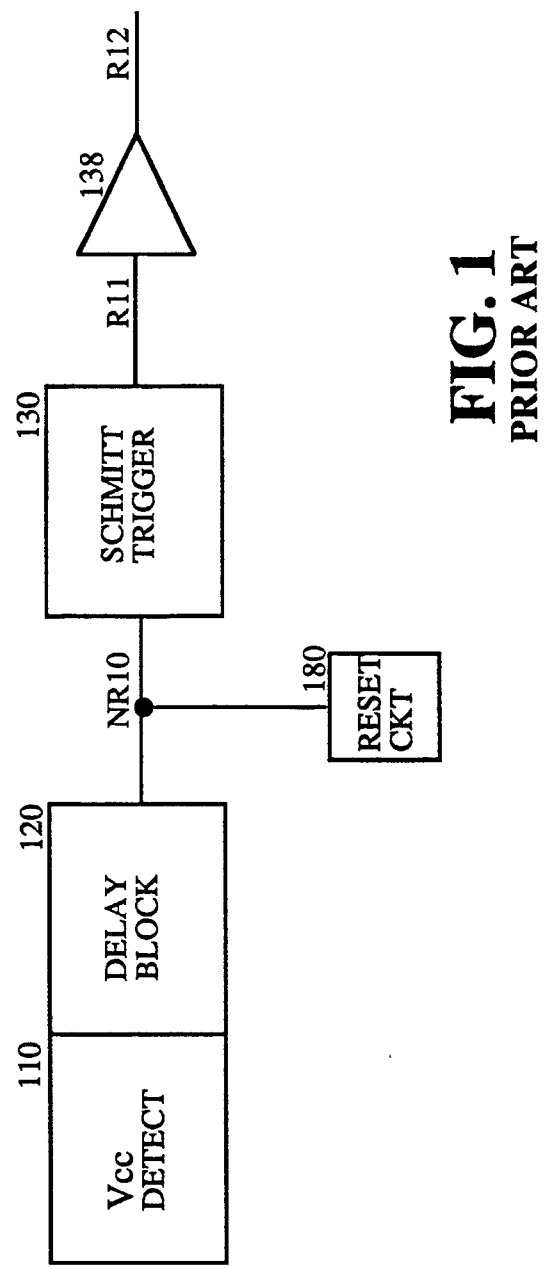
FIG. 1 shows a block diagram of a prior art power-on reset circuit.
Figure 3A:
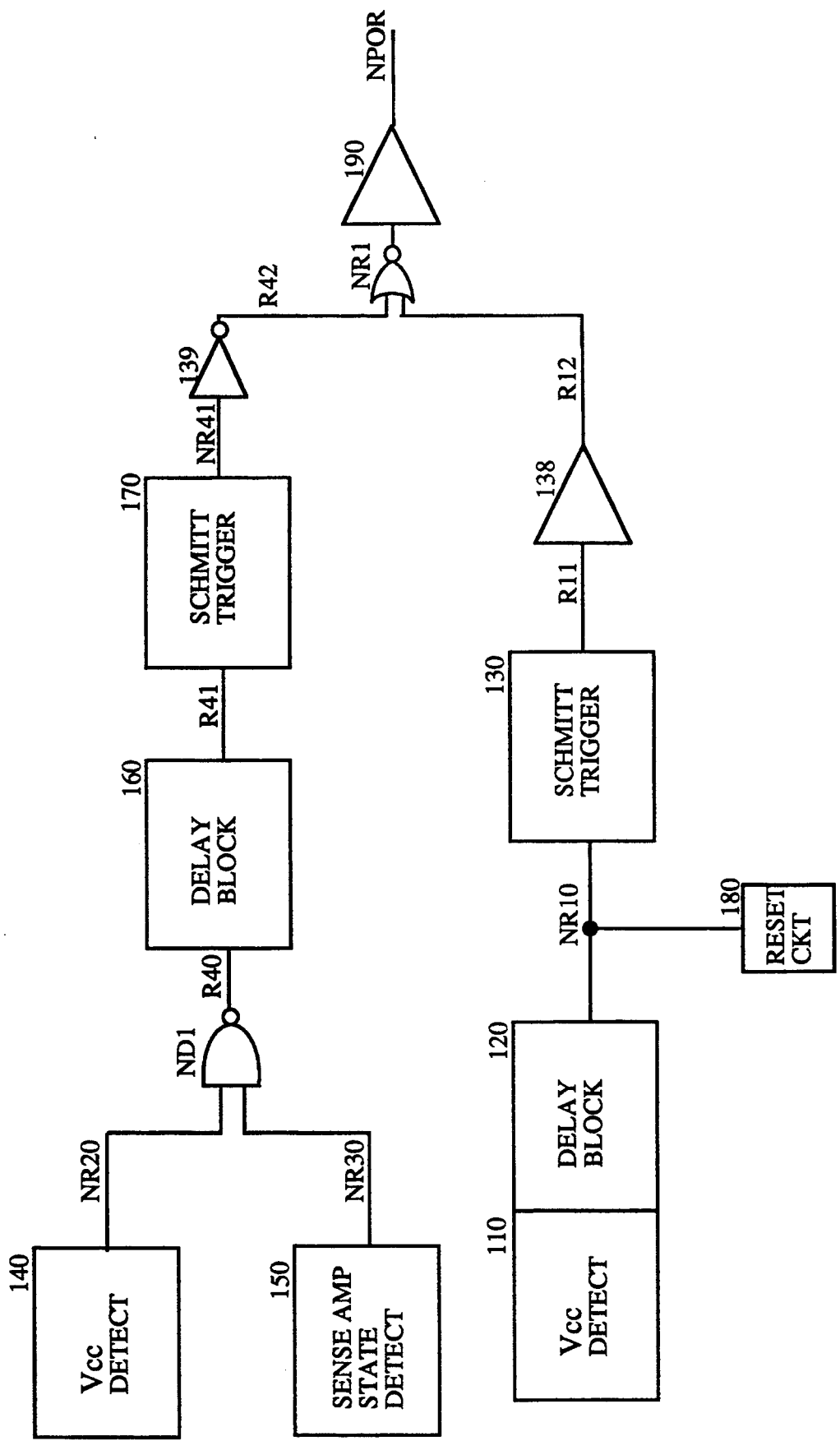
FIG. 3A shows a block diagram of another power-on reset circuit of the present invention.

FIG. 3A shows a block diagram of a second embodiment of the invention. The circuit of FIG. 1 is combined with the circuit of FIG. 2. Output signals R42 and R12 are combined by NOR gate NOR1 and buffered by buffer 190 to produce active low power-on reset signal NPOR, which goes high only when three conditions have been satisfied and the signals have successfully been controlled by delay blocks 160 and 120 and Schmitt triggers 170 and 130.

Figure 3B:
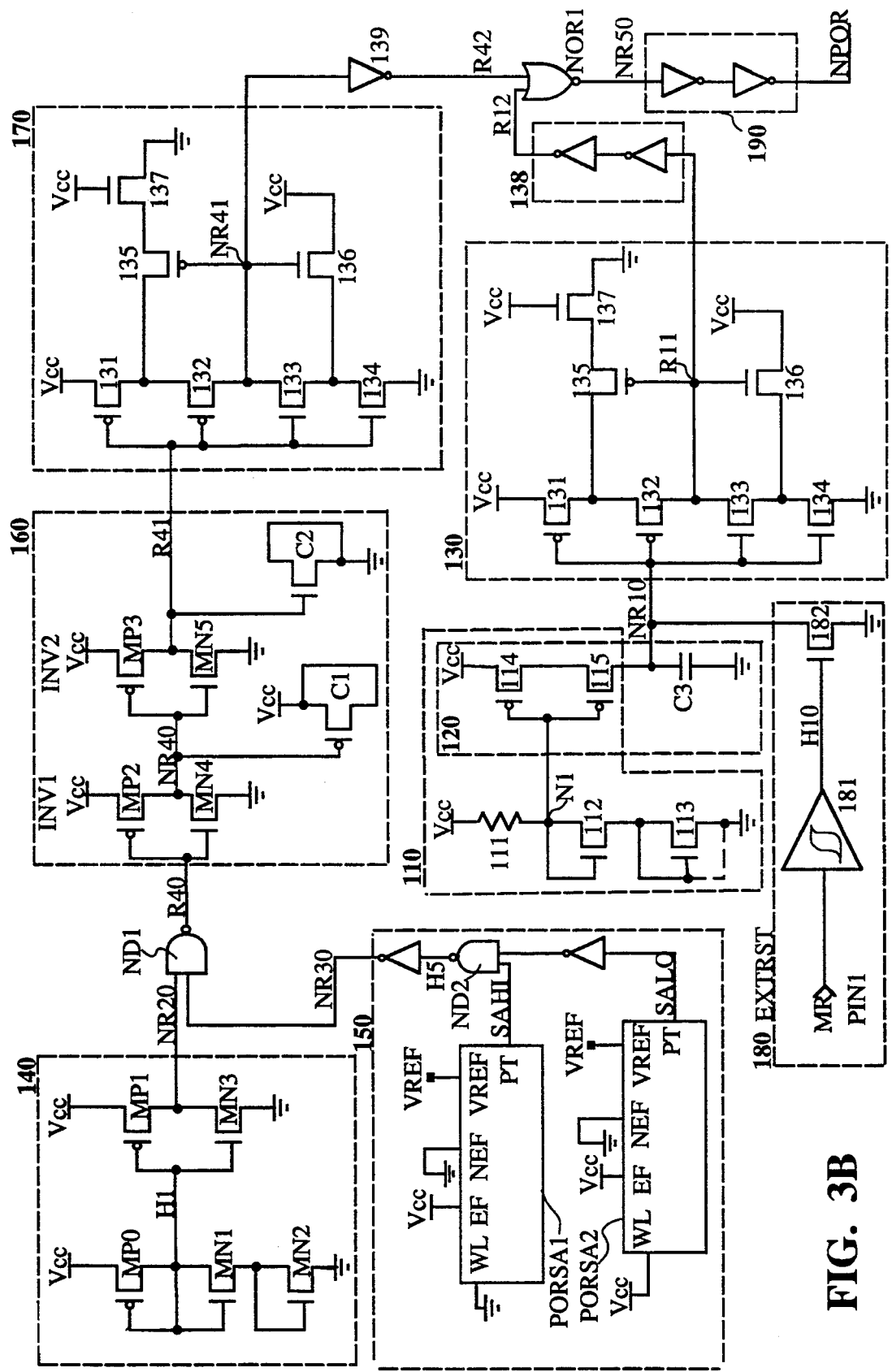
FIG. 3B shows a circuit diagram of the power-on reset circuit of FIG. 3A.

FIG. 3B shows a detailed circuit diagram of the block diagram of FIG. 3A.

First Vcc Detect Circuit

Circuit 140 includes a first stage of series connected transistors, P-channel transistor MP0, and N-channel transistors MN1 and MN2, and a second stage, which is a CMOS inverter comprising series connected P-channel transistor MP1 and N-channel transistor MN3 connected between Vcc and ground. Gates of transistors MP0, MN1, MP1, and MN3 are commonly connected to drains of transistors MP0 and MN1. The gate of transistor MN2 is connected to a node between the drain of transistor MN2 and the source of transistor MN1. The source of transistor MP0 is connected to Vcc and the source of transistor MN2 is connected to ground.

Circuit 140 detects 2Vtn+Vtp, that is it detects when Vcc has risen to a value equal to 2Vtn+Vtp where Vtn is the threshold voltage of each of the N-channel transistors MN1 and MN2, and Vtp is the threshold voltage of P-channel transistor MP1. As Vcc rises from zero after power is first applied to the circuit, all voltages are initially at zero. Transistor MP1 turns on when its source, Vcc, is higher by Vtp than H1. When Vcc has risen to Vtp, transistor MP0, which has a gate voltage of 0 volts, begins to turn on. As Vcc rises, node H1 follows Vcc, being lower by Vtp. Once node H1 has risen to Vtn (of transistor MN3), transistor MN3 turns on and node NR20 goes low. As Vcc continues to rise, node H1 reaches a level equal to 2Vtn (of MN1 and MN2). Thus transistors MN1 and MN2 turn partly on and prevent a further rise at H1. Transistors MN1 and MN2 are manufactured as strong transistors, that is to have a high width to length ratio, whereas transistor MP0 is manufactured to be a weak transistor with a low width to length ratio. In a preferred embodiment, the width to length ratio of transistors MN1 and MN2 is about 30 where the width to length ratio of transistor MP0 is about 2. Thus, as Vcc rises above Vtp+2Vtn, transistor MP0 acts as a resistor and the voltage at H1 is 2Vtn as determined by transistors MN1 and MN2. When Vcc reaches 2Vtn+Vtp (of MP1), transistor MP1 turns on. Transistor MN3 is manufactured to be a weak transistor (low ratio of channel width to channel length) and thus has high resistance compared to transistor MP1. Thus when transistor MP1 turns on, node NR20 goes high and indicates that the voltage requirement has been met. Transistor MP1 is manufactured to be strong, with a preferred width to length ratio of about 30. Transistor MN3 is weak with a ratio of about 1. Thus the voltage on NR20 is near Vcc when Vcc is at least 2Vtn+Vtp. The voltage on NR20 is 0 when the voltage on H1 is between Vtn and 2Vtn (when Vcc is between Vtn+Vtp and 2Vtn+Vtp).

Since the Vcc detect circuit detects a voltage 2Vtn+Vtp, and NAND gate ND1 operates properly at a voltage above the greater of Vtn and Vtp, by the time a logical 1 output signal is provided on node NR20, NAND gate ND1 will be able to respond properly to the input signal.

Sense Amplifier State Detect

Circuit 150 provides that the POR circuit remains in the reset mode until sense amplifiers in the device will work properly. Sense amplifiers are analog circuits that maintain voltage on an input line at close to the trigger point of other devices driven by the input line. Sense amplifiers switch state very quickly in response to a small change in voltage on the input line, in the present example a bit line. To pull down a bit line BL, EPROMs selectively connect the bit line to a virtual ground (VG). The gate of each EPROM is connected to a word line WL, such that a high signal on any word line pulls the bit line BL to a low voltage. Sense amplifiers are low current input circuits and respond very quickly to small changes in input voltage. Elsewhere in the device, sense amplifiers are controlled by input signals on bit lines BL, which are connected to a virtual ground (higher than actual ground) through EPROMs. Connecting bit lines to virtual ground saves power and increases speed.

Figure 4:
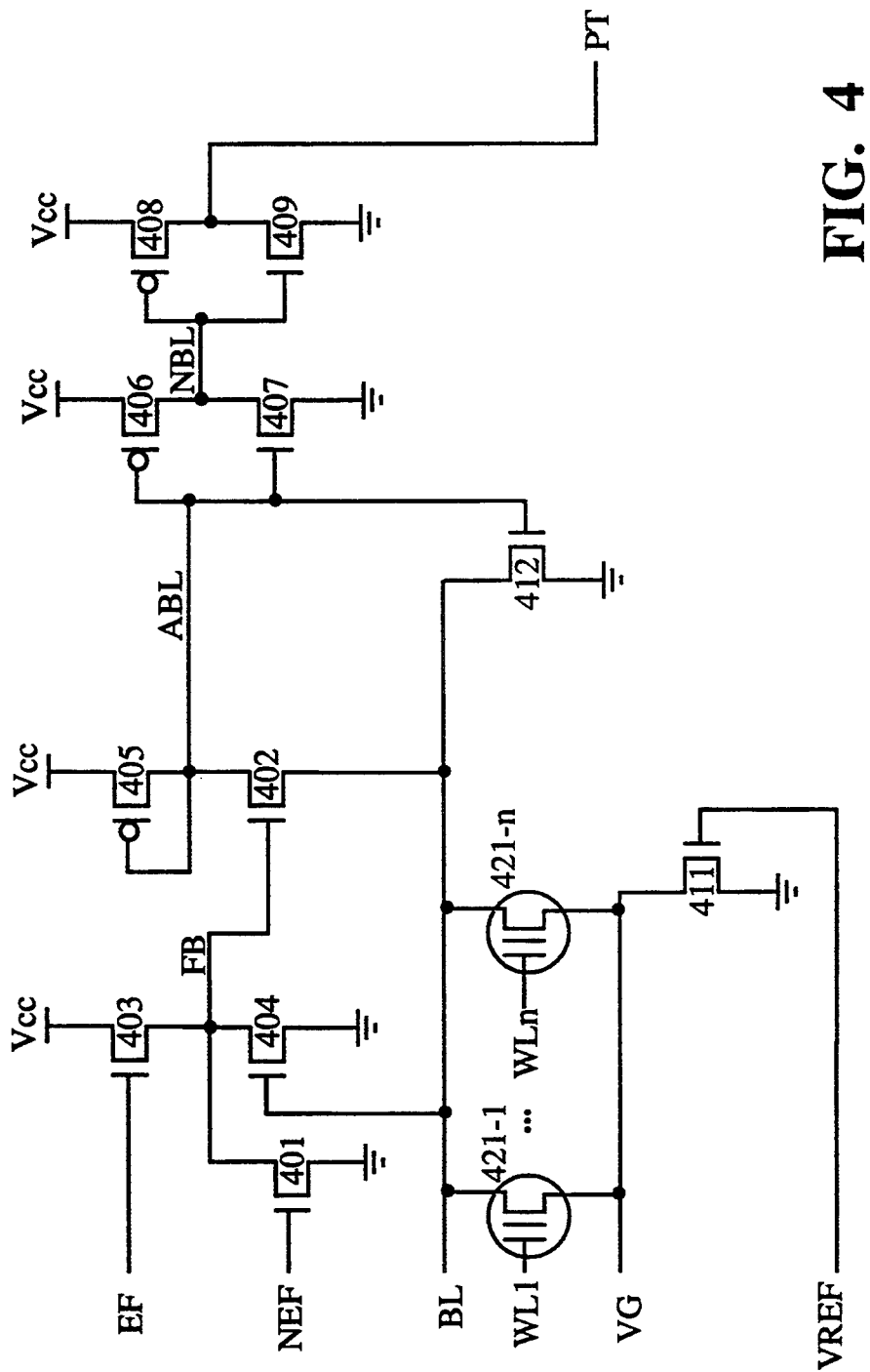
FIG. 4 shows a sense amplifier used in a device with which the invention can be used.
Figure 5:
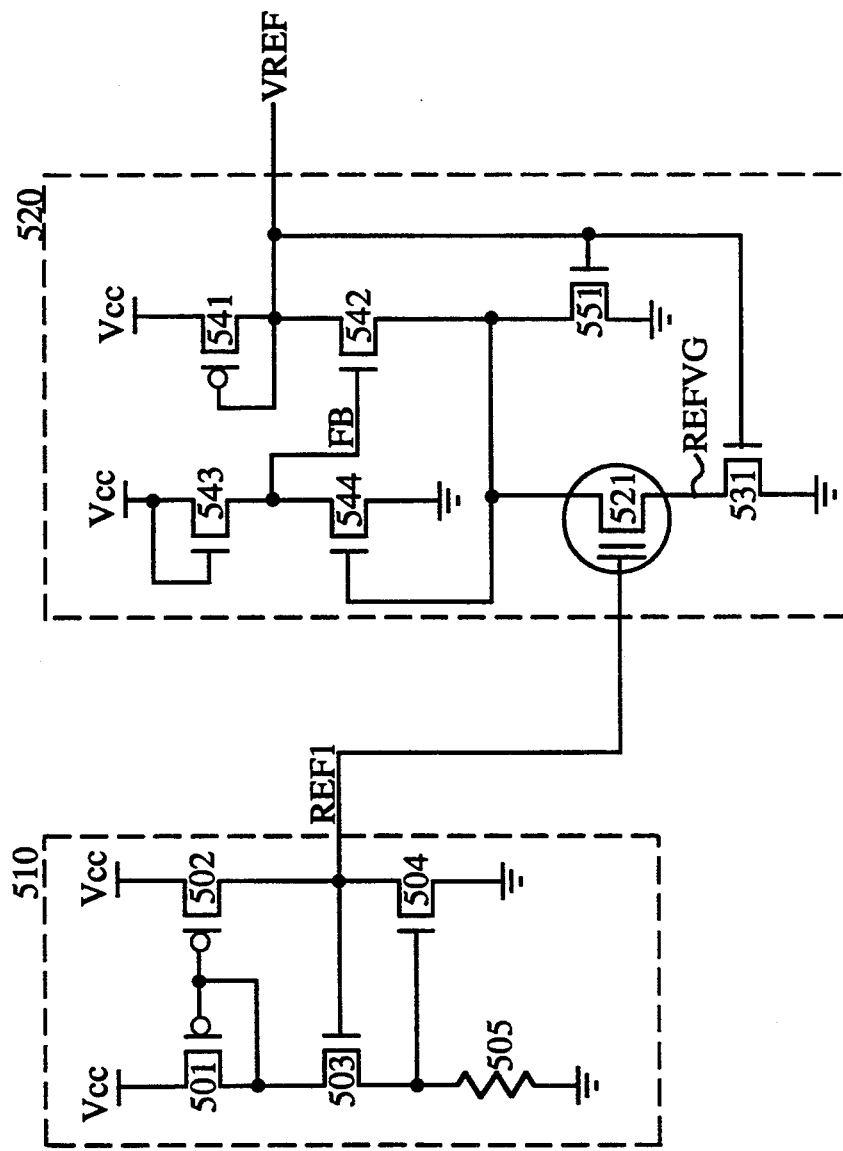
FIG. 5 shows a reference voltage generating circuit which provides the reference voltage used in the circuit of FIG. 4.

Operation of one embodiment of the sense amplifiers of FIG. 3B can be understood by the following description of FIGS. 4 and 5. FIG. 4 shows a sense amplifier used in circuits with which the invention can work. This sense amplifier has two enable signals EF and NEF. The sense amplifier is turned on or enabled by applying logical 1 to EF and logical 0 to NEF. Node FB controls transistor 402, which operates in its linear range. The voltage level on node FB is established by weak pull-up transistor 403 (width to length ratio about 0.5) and strong pull-down transistor 404 (width to length ratio about 12). Weak transistor 403 (width to length ratio about 0.5) pulls up bit line feedback node FB to a voltage determined by the strength of pull-up transistor 403 and pull-down transistor 404, but transistor 404 (width to length ratio about 12) provides a strong pull-down toward ground. A weak P-channel transistor 405 and a strong N-channel transistor 402, with the bit line signal BL controlling the N-channel transistor 402 gives a low trigger point at a bit line voltage on the order of 0.75 volts. If bit line BL is high, transistor 404 turns more on, line FB is pulled lower and causes transistor 402 to carry less current so that it pulls up bit line BL less, which assists the next movement of the bit line (going low). Conversely if BL is low, FB is higher and transistor 402 carries more current, pulling bit line BL to a higher voltage. P-channel transistor 405 is a weak transistor and serves as a current source, operating in saturation mode. Thus the voltage on line ABL is controlled by transistor 402 in conjunction with bit line BL. Transistors 406 and 407 form a ratioed inverter and transistors 408 and 409 form a second ratioed inverter, generating an output voltage on node PT at CMOS levels in response to the input signal on bit line BL. Table 1 shows one example of logical 0 and logical 1 voltage values on the lines BL, FB, ABL, NBL, and PT.

TABLE 1

| Signal | Logical 1 | Logical 0 | Difference |
|--------|-----------|-----------|------------|
| BL     | 0.769 v   | 0.746 v   | 0.023 v    |
| FB     | 1.77 v    | 1.88 v    | 0.11 v     |
| ABL    | 2.76 v    | 2.18 v    | 0.58 v     |
| NBL    | 0.491 v   | 3.33 v    | 2.84 v     |
| PT     | 4.4 v     | 0 v       | 4.4 v      |

Table 1 shows that a small swing in the bit line BL voltage can produce a switch in the sense amplifier output signal PT. The 4.4 volt logical 1 level was obtained at worse case (hot) conditions. Nominal logical 1 output voltage is 5 volts.

Depending upon the states of EPROMs 421-1 through 421-n as controlled by word lines WL1 through WLn, bit line BL will be pulled lower or higher to indicate a logical 0 or logical 1. If any of word lines WL1 through WLn is a logical 1, bit line BL will be pulled lower to indicate logical 0. When biased on, EPROMs 421-1 through 421-n pull bit line BL toward virtual ground VG. As shown in FIG. 4, virtual ground VG is separated from actual ground by transistor 411, which is controlled by a reference value gate voltage VREF. The VREF signal provides a stable reference voltage close to the trigger point of the sense amplifier of FIG. 4.

FIG. 5 shows a circuit which generates the reference voltage VREF. Initial stage 510 generates a reference voltage REF1. Stage 510 uses a current mirror (transistors 501 and 502) with equal current in both legs (through transistors 503 and 504) and thereby generates a steady reference voltage REF1. Transistor and resistor sizes are chosen such that REF1 is close to the trigger point of the sense amplifiers of FIG. 4. Thus, the gate of EPROM 521 is held close to the trigger voltage of the sense amplifier. Stage 520 of FIG. 5 imitates the sense amplifier of FIG. 4. EPROM 521 of FIG. 5 corresponds to EPROM 421 of FIG. 4, and is biased by REF1. Transistors 541 and 542 correspond to transistors 405 and 402 respectively, and provide active pull-up. Transistor 403 compares to transistor 543. Transistor 404 to transistor 544. Transistor 531 corresponds to transistor 411. Sizes of corresponding transistors are the same as in the sense amplifier of FIG. 4. Line FB in stage 520 corresponds to line FB of FIG. 4. Since all transistor sizes are the same, voltages are also approximately the same. As mentioned before, the voltage on line FB is about 1.85 volts, so transistor 542 is not strongly on, but it provides some pullup current. EPROM 521 has to defeat the pullup. If EPROM 521 is more strongly on, VREF will be pulled lower. REF1 provides just the voltage so that EPROM 521 carries just enough current to pull down VREF to the trigger point of the sense amplifier of FIG. 4. VREF is applied to every sense amplifier in the device. The VREF value generated by the circuit of FIG. 5 is applied to the gate of transistor 411 of FIG. 4, and maintains bit line voltages in the sense amplifier of FIG. 4 close to the sense amplifier trigger point. Thus the VREF voltage controlled by EPROM 521, which is controlled by a steady state voltage REF1, is steady state whereas signals vary on bit lines BL of the sense amplifiers.

Small changes in bit line voltage must be properly detected by the sense amplifiers in order for the device to function properly. The prior art power-on reset circuit such as shown in FIG. 1 might cause the device to fail if it took the device out of reset mode before the sense amplifiers were working properly. This result could happen if the temperature and process conditions were such that the sense amplifiers would work only for a Vcc significantly greater than the 2Vtn+Vtp detect value. To assure that sense amplifiers in the device will operate properly before the power-on reset signal is released, two sense amplifiers are included in the power-on reset circuit. In FIG. 3B, circuit 150 includes two sense amplifiers PORSA1 and PORSA2, which match those elsewhere in the device. Sense amplifier PORSA1 is connected as a sense amplifier elsewhere in the device would appear if all EPROMs connecting that sense amplifier to virtual ground were biased off, that is, if all word lines WL1 through WLn (FIG. 4) were logical 0, representing a logical 1 state on bit line BL. Sense amplifier PORSA2 is connected as a sense amplifier elsewhere in the device would appear if the EPROM connecting that sense amplifier to virtual ground were biased on, representing a logical 0 state. Thus sense amplifier PORSA2 includes an EPROM equivalent to EPROM 421-1 of FIG. 4, and the gate of that EPROM equivalent to word line WL1 is tied to Vcc. Thus EPROM 421-1 in sense amplifier state detect circuit PORSA2 is biased on, and therefore ties bit line BL to virtual ground VG.

The schematic drawings of sense amplifiers PORSA1 and PORSA2 of circuit 150 include input ports EF and NEF. These control whether the sense amplifier is turned on. As connected in FIG. 3B, both PORSA1 and PORSA2 are turned on. But sense amplifiers PORSA1 and PORSA2 must also function properly before the chip is taken out of its reset mode. NAND gate ND1 assures that the reset signal R40 remains high until both NR20 and NR30 are high. NR30 is high only if H5 is low. NAND gate ND2 gives a low H5 signal only if both SAHI is high and SALO is low. This condition occurs only if sense amplifiers PORSA1 and PORSA2 are both able to detect their respective levels of logical 1 and logical 0 respectively.

Applying the output of sense amplifier PORSA2 through an inverter to NAND gate ND2 and applying the output of PORSA1 directly to NAND gate ND2 means that NAND gate ND2 will produce a logical low on node H5 only when the two sense amplifiers PORSA1 and PORSA2 properly detect their respective logical states.

Sense amplifiers PORSA1 and PORSA2 are manufactured by the same process and with the same sizes as other sense amplifiers in the chip. Therefore they will begin to operate properly when other sense amplifiers can properly detect both logical 0 and logical 1 levels.

As mentioned above, sense amplifiers which match sense amplifiers used elsewhere are used in circuit 150 of FIG. 3B. The important feature of the invention is that the sense amplifier or amplifiers in the power-on reset circuit match sense amplifiers elsewhere in the circuit; it is not necessary that the sense amplifier look like that in FIG. 4. Thus, according to the invention, the power-on reset signal will not go out of reset mode until the sense amplifiers in the rest of the device work properly.

NAND gate ND1 combines the signal on node NR20 from Vcc detect circuit 140 with the signal on node NR30, inverted from the signal on node H5. Thus NAND gate ND1 provides a logical low signal on node R40 only when Vcc is sufficient and when sense amplifiers in the device will operate properly.

Delay block 160 receives the signal from node R40. It is desired that delay block 160 insert a sizeable delay when the device is in reset mode (when the R40 signal is high) so that the device will remain in reset mode until signals are stable. But it is desirable during normal operation (when R40 is low) that the device move quickly into reset mode if a power glitch occurs. Therefore delay block 160 provides a quick response to a rising voltage on R40 and a slow response to a falling voltage on R40. Delay block 160 includes inverters INV1 and INV2, with capacitors C1 and C2 at their respective outputs. As shown, capacitor C1 is tied to Vcc and capacitor C2 is tied to ground. Capacitor C1 is formed as a P-channel transistor and capacitor C2 is formed as an N-channel transistor. Weak P-channel transistor MP2 will charge up capacitor C1 while bringing node NR40 from 0 to 1. Capacitor C1 will have a higher capacitance if its channel is initially inverted when node NR40 is at 0 volts (when the device is in reset mode). Therefore source and drain of capacitor C1 are tied to Vcc. Likewise, weak N-channel transistor MN5 will pull down node R41 while charging capacitor C2, which for greatest capacitance is tied to ground. Thus the output signal on node R41 rises to logical 1 after a short delay from the time R40 rises to a logical 1 but falls to logical 0 slowly after R40 falls to logical 0.

In delay block 160 it is necessary that the values of Vcc and ground used to supply inverters and capacitors be taken from the same supply rails; otherwise there may be false triggering. It is important that each element be on the same strip. All Vcc values must be the same and all ground values must be the same.

Schmitt trigger circuit 170 provides a feedback signal through transistors 135 and 136 which are controlled by the output signal at output node NR41. When the voltage at node NR41 is relatively high, transistor 135 is relatively or completely off, therefore not pulling down the voltage between transistors 131 and 132. Transistor 136 is on, therefore pulling up the voltage between transistors 133 and 134. Thus the already high voltage on node NR41 is made higher by the feedback circuits and it is necessary to turn transistors 131 and 132 more strongly off and 133 and 134 more strongly on with the input signal on node R41 before the state of node NR41 will switch. The same stabilizing result occurs for a low voltage at node NR41. Thus Schmitt trigger 170 provides a higher trigger point to a rising voltage than to a falling voltage and therefore exhibits some noise immunity to the signal on R41. The Schmitt trigger guard band is about 200–400 mv (0.2 to 0.4 v)

Second Vcc Detect Circuit

Vcc detect circuit 110 and delay circuit 120 operate in a manner similar to circuits 140 and 160 described above. The output at node NR10 is a logical 1 when Vcc is above Vtp+2Vtn where Vtp is the threshold voltage of transistors 114 and 115 in circuit 120, and Vtn is the threshold voltage of transistors 112 and 113 in circuit 110. Transistors 114 and 115 are weak pullup transistors and combine with capacitor C3 to produce a delayed rise in voltage on node NR10 after transistors 114 and 115 are turned on, which occurs when Vcc rises sufficiently above the voltage at node N1. In the embodiment of circuit 120, no internal pull-down means on node NR10 is provided. An advantage of Vcc detect circuit 140 is that with pull-down transistor MN3, it will detect a fall in Vcc as well as a rise. If Vcc falls below 2Vtn+Vtp, circuit 140 will cause the POR circuit of FIG. 3B to issue the master reset signal.

External Reset

In the embodiment of FIG. 3B, node NR10 is pulled down by an external reset signal MR on PIN1 leading through buffer 181 to node H10. Buffer 181 may be implemented as an inverting TTL buffer which drives an inverting Schmitt trigger circuit. Buffer 181 controls the gate of transistor 182. A high MR signal causes transistor 182 to pull node NR10 to ground. When an external reset signal is removed, voltage on node NR10 must again rise sufficiently for reset to be released.

Schmitt trigger 130 is identical to Schmitt trigger 170 described earlier. However, the sense of signals input to Schmitt trigger 130 is opposite to that of signals input to Schmitt trigger 170.

Second Embodiment

Figure 6:
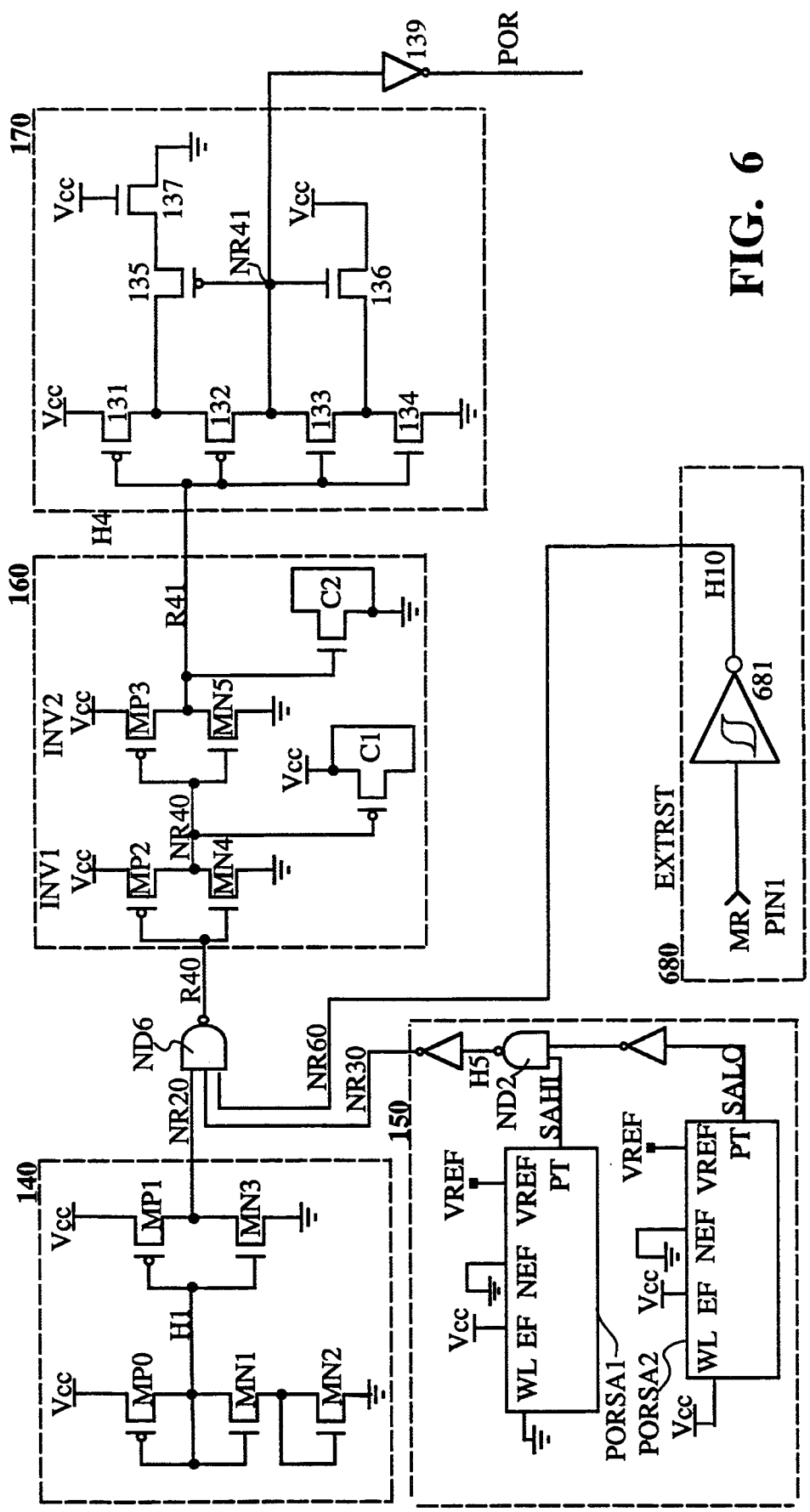
FIG. 6 shows a second embodiment of the invention, corresponding to the block diagram of FIG. 2.

FIG. 6 shows a second embodiment of the invention, corresponding to the block diagram of FIG. 2. The circuit of FIG. 6 includes circuits 140, 150, 160, and 170 as shown and discussed in connection with FIG. 3B. NAND gate ND6 is a three-input NAND gate and receives a third input NR60 from external reset circuit 680. External reset circuit 680 differs from external reset circuit 180 in the fact that buffer 681 is an inverting buffer. Buffer 681 may be implemented as an inverting TTL buffer which drives a noninverting Schmitt trigger. Thus a high master reset signal MR on master reset pin PIN1 causes inverting buffer 681 to pull down node NR60 and produce a logical 1 on node R40. This places the circuit of FIG. 6 into reset mode, producing a high POR output signal. Likewise a low NR20 signal from Vcc detect circuit 140 or a low NR30 signal from sense amplifier state detect circuit 150 places the device into reset mode by generating a high POR signal. Only when all three of the signals on nodes NR20, NR30, and NR60 are high does the power-on reset circuit, after a delay through circuit 160 and a voltage margin from Schmitt trigger 170 take the device out of reset mode with a low POR signal.

In light of the above description, other embodiments will become obvious to those skilled in the art. Such other embodiments are intended to fall within the scope of the invention.

I claim:

1. A power on reset circuit for an integrated circuit device, said power on reset circuit comprising:
   means for providing a first detect signal if a supply voltage exceeds a first specified value;
   a sense amplifier circuit powered by said supply voltage for indicating that sense amplifiers in said integrated circuit device will work properly, said sense amplifier circuit including:
      a first sense amplifier which provides a first amplifier output signal,
      a second sense amplifier which provides a second amplifier output signal, and
      a first logic gate for receiving said first and second amplifier output signals and providing a second detect signal; and
   a second logic gate for receiving said first and second detect signals and providing an output signal.

2. A power on reset circuit as in claim 1 where said first specified value is larger than the minimum value needed to operate logic gates in said integrated circuit device.

3. A power on reset circuit as in claim 1 further comprising:
   a Schmitt trigger responsive to said output signal, wherein said Schmitt trigger switches state at a higher voltage level if said output signal is rising and a lower voltage level if said output signal is falling.

4. A power on reset circuit as in claim 3 further comprising:
   delay means coupled between said first logic gate and said Schmitt trigger.

5. A power on reset circuit as in claim 4 wherein said delay means includes at least two inverters.

6. A power on reset circuit for an integrated circuit device having a plurality of sense amplifiers, said power on reset circuit comprising:
   means for providing a first detect signal if a first supply voltage exceeds a specified value;
   means for providing a second detect signal, wherein said means for providing a second detect signal receives a reference voltage which substantially matches the trigger points of said means for providing a second detect signal and said plurality of sense amplifiers in said integrated circuit device; and
   a first logic gate for receiving said first and second detect signals and providing an output signal;
   wherein said means for providing a first detect signal comprises:
      a first N-channel transistor and a first P-channel transistor connected in series between said first supply voltage and a second supply voltage; and
      a second P-channel transistor and a second N-channel transistor connected in series between said first supply voltage and said second supply voltage, said first detect signal being taken from a node between said second P-channel transistor and said second N-channel transistor, wherein the gates of said first and second N-channel transistors and said first and second P-channel transistors are commonly connected;

wherein said first and second N-channel transistors have a threshold voltage Vtn, said first and second P-channel transistors have a threshold voltage Vtp, wherein said first detect signal is a logical high signal provided said first supply voltage is greater than Vtp+Vtn.

7. A power on reset circuit as in claim 6 further including a third N-channel transistor connected in series with said first N-channel transistor, wherein said first detect signal is a logical high signal provided said first supply voltage is greater than Vtp+2Vtn.

8. A power on reset circuit for an integrated circuit, said power on reset circuit comprising:

means for providing a first detect signal if a supply voltage exceeds a specified value;

means for providing a second detect signal; and a first logic gate for receiving said first and second detect signals and providing an output signal, wherein said means for providing a second detect signal comprises two sense amplifiers manufactured by the same process and with the same component sizes as sense amplifiers elsewhere in said integrated circuit, said sense amplifiers providing said second detect signal only if said supply voltage reaches a predetermined level.

9. A power on reset circuit as in claim 8 in which said two amplifiers comprise:

a first sense amplifier which generates a logical 1 output signal if said supply voltage reaches said predetermined level; and a second sense amplifier which generates a logical 0 output signal if said supply voltage reaches said predetermined level;

and wherein said means for providing a second detect signal comprises:

sense amplifier gating means which provides said second detect signal in response to a combination of said logical 1 from said first sense amplifier and said logical 0 from said second sense amplifier.

10. A power on reset circuit for an integrated circuit device, said power on reset circuit comprising:

means for providing a first detect signal if a first supply voltage exceeds a specified value;

means for providing a second detect signal, wherein said means for providing a second detect signal has a trigger point which matches the trigger point of at least one sense amplifier in said integrated circuit device;

a first logic gate for receiving said first and second detect signals;

a Schmitt trigger responsive to an output signal provided by said first logic gate, wherein said Schmitt trigger switches state at a higher voltage level if said output signal is rising and a lower voltage level if said output signal is falling; and delay means coupled between said first logic gate and said Schmitt trigger, wherein said delay means includes:

a first inverter and a second inverter connected in series between said first logic gate and said Schmitt trigger; and a first capacitor and a second capacitor, said first capacitor connected to a node between said first and second inverters, said second capacitor connected between a node between said second inverter and said Schmitt trigger.

11. A power on reset circuit for an integrated circuit device, said power on reset circuit comprising:

means for providing a first detect signal if a first supply voltage exceeds a specified value;

means for providing a second detect signal;

a first logic gate for receiving said first and second detect signals;

means for providing a third detect signal if said voltage supply exceeds a second specified value; and a second logic gate for receiving an output signal from said first logic gate and an output signal from said means for providing a third detect signal and providing an output signal.

12. A power on reset circuit as in Claim 11 in which said first and second specified values are equal.

13. A power on reset circuit as in claim 12 wherein said means for providing a first detect signal includes a plurality of N-channel transistors and a plurality of P-channel transistors, wherein said first and second specified values are Vtp+2Vtn where Vtn is the threshold voltage of each of said plurality of N-channel transistors and Vtp is the threshold voltage of each of said plurality of P-channel transistors.

14. A power on reset circuit as in claim 11 wherein said means for providing a third detect signal includes means for delaying said third detect signal if said supply voltage value exceeds said second specified value.

15. A power on reset circuit as in claim 11 wherein said means for providing a third detect signal comprises:

means for generating a first stage output signal no greater than a first predetermined value; and means for supplying said third detect signal if said supply voltage exceeds said first stage output signal by a second predetermined value.

16. A power reset circuit as in claim 1 further comprising a reset device, wherein said second logic gate receives an output signal from said reset device.

* * * * *